United States Patent [19]

Fillot et al.

[11] Patent Number: 4,564,415
[45] Date of Patent: Jan. 14, 1986

[54] PROCESS FOR PRODUCING TERNARY OR QUATERNARY SEMICONDUCTOR COMPOUNDS

[75] Inventors: Alain Fillot, St. Ismier; Jean Gallet, Grenoble; Sylvain Paltrier, Meylan; Bernard Schaub, Grenoble, all of France

[73] Assignee: Commissariat a l'Energie Atomique, Paris, France

[21] Appl. No.: 556,583

[22] Filed: Nov. 30, 1983

[30] Foreign Application Priority Data

Nov. 30, 1982 [FR] France ................................ 82 20053

[51] Int. Cl.$^4$ ................................................ C30B 9/06
[52] U.S. Cl. ................................ 156/604; 156/616 R; 156/DIG. 72
[58] Field of Search ...... 156/616 R, 617 V, DIG. 72, 156/DIG. 82, 604

[56] References Cited

U.S. PATENT DOCUMENTS 3,849,205  11/1974  Bran et al. ............................ 148/171

FOREIGN PATENT DOCUMENTS 60744    9/1982  European Pat. Off. .
2295792  7/1976  France .
2051607  1/1981  United Kingdom .

OTHER PUBLICATIONS

Fiorito et al, J. Electrochemical Society, vol. 125, No. 2, 1978, pp. 315-317.
Ueda et al, J. of Crystal Growth 13, 14 1972, 668-671.
Academie des Sciences de Paris, vol. 261, 7/26/65, p. 931 ft.

Primary Examiner—Hiram H. Bernstein
Attorney, Agent, or Firm—Michael N. Meller

[57] ABSTRACT

Process for producing ternary or quaternary semiconductor compounds, particularly of formula Cd Hg Te or Cd Hg Te Se.

It comprises the following stages:
  forming a homogeneous mixture having a precise composition and corresponding to the compound to be obtained, of Cd Te and Hg Te powders in the case of the ternary compound Cd Hg Te and Cd Te Se and Hg Te or Cd Te and Hg Te Se powders in the case of the quaternary compound Cd Hg Te Se;
  the mixture is compacted by applying a pressure;
  the thus compacted mixture undergoes thermal interdiffusion treatment;
  the recrystallization of the compound in monocrystalline form takes place by a single passage through the solvent zone.

8 Claims, 2 Drawing Figures

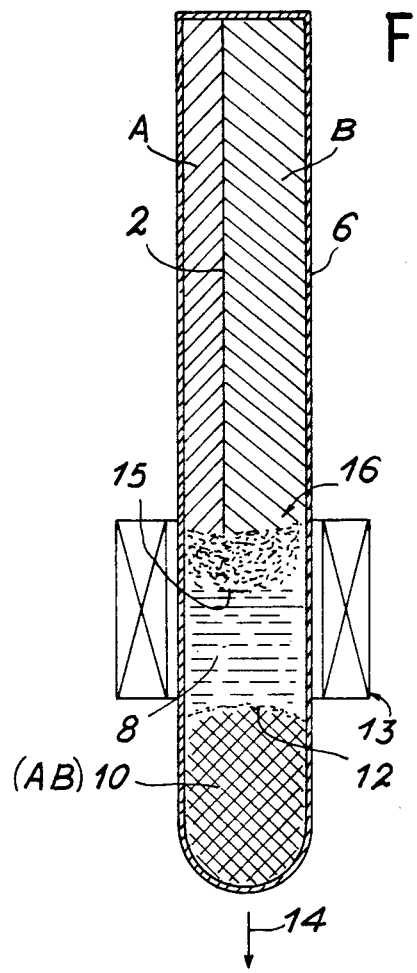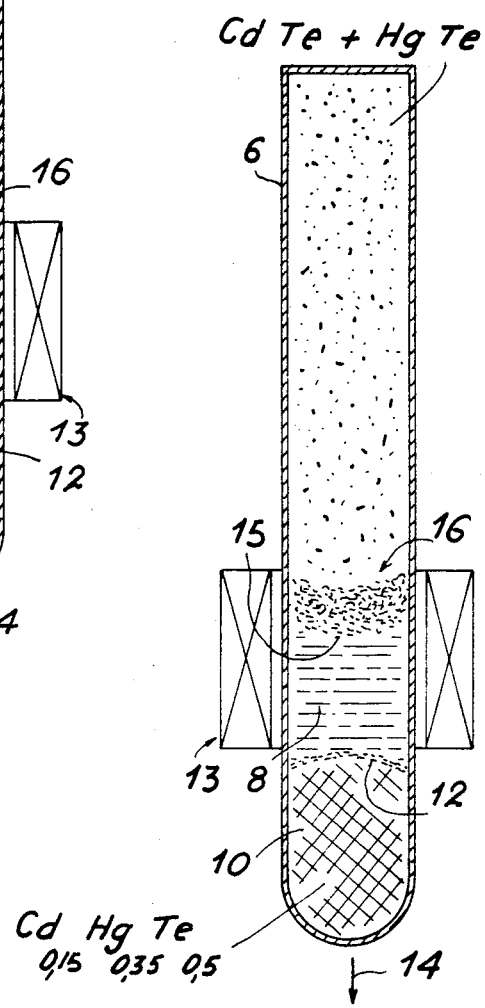

PROCESS FOR PRODUCING TERNARY OR QUATERNARY SEMICONDUCTOR COMPOUNDS

BACKGROUND OF THE INVENTION

The present invention relates to the production of ternary or quaternary semiconductors from a solvent zone, and more specifically to the improvement, in the specific case of the compounds $Cd_xHg_{0.5-x}Te_{0.5}$ and $Cd_xHg_{0.5-x}Te_ySe_{0.5-y}(0<x<0.5; 0<y<0.5)$, of the method described in French Pat. EN No. 744 2769, filed on Dec. 24, 1984 by the Commissariat a l'Energie Atomique.

The aforementioned method consists of passing through a solvent zone at a specific temperature contiguous bars of elements or alloys of elements thereby bringing about the synthesis and crystallization of composite semiconductors.

The aforementioned known method is illustrated in FIG. 1, which shows two ingots A and B corresponding to one of the constituent compounds of the semiconductor formed.

In FIG. 1 this drawing, the two ingots A and B forming the bar are cylindrical, have the same diameter and are laterally truncated along face 2 and are joined by the same face. The assembly of said two ingots A and B is introduced into a cylindrical quartz weighing scoop 6 in the vertical position and is passed through an induction furnace 13, within which there is formed a solvent zone 8, previously placed at the end of the scoop at which crystallization starts and The induction furnace 13 heats the scoop portion passing therethrough and its contents in the portion facing the furnace. Scoop 6 moves in the direction of arrow 14 through the annular space defined by the furnace. After passage through the furncace, the contents of the scoop portion crystallize, forming zone 10.

During growth, it is possible to successively observe zone 10 in which crystal AB is located, crystallization interface 12, solvent zone 8, dissolving interface 15 and a reaction starting area 16, where the compounds are in a close to stoichiometric proportion with a view to the formation of crystal AB.

From a general standpoint, the use of a solvent makes it possible to produce composite semiconductors at a temperature below the melting temperature thereof, and consequently to obtain materials which are purer and have a better crystalline quality. Specifically, the use of a solvent in the case of compounds Cd Hg Te and Cd Hg Te Se also makes it possible to obtain independence from the high mercury vapor pressures at the melting temperatures of these compounds.

The production process described in patent EN 7442769 meets the aforementioned general and special conditions, but is difficult to perform in the case of producing Cd Hg Te or Cd Hg Te Se.

Thus, the dissolving by means of the solvent (in this specific case either tellurium, or liquids $Hg_yTe_z$ or $Cd_xHg_yTe_z$ with $z>0.5$ and $x+y+z=1$) of the two bars of alloys Cd Te and Hg Te for the ternary compound Se and Cd Te and Hg Te or Cd Te and Hg Te Se for the quaternary compound preferably takes place on the mercury chalcogenide, thus placing the solvent zone outside the thermodynamic equilibrium. In the use of the solvent ($Hg_yTe_z$ or $Cd_xHg_yTe_z$), z is higher than 0.5, i.e. in excess and mixtures and not compounds are involved. The ternary or quaternary composite semiconductor materials then obtained in crystalline form are in a state making it difficult to work them and generally requiring, in order to have a satisfactory quality, a second passage through the solvent zone.

In addition, the electronic devices produced with these ternary or quaternary composite semiconductors require a precise ratio of the cadmium content to the mercury, the atomic fraction x of the cadmium having to be established e.g. at better than 0.5 atomic %. This precision also presupposes strict attention to the geometrical shape of the two initial alloy bars, i.e. a precise and careful machining thereof prior to their use.

SUMMARY OF THE INVENTION

The present invention relates to a process making it possible to overcome the aforementioned difficulties and to obtain, in a single operation, the low-temperature crystallization of ternary and quaternary materials, such as Cd Hg Te and Cd Hg Te Se having the requisite crystalline quality and composition homogeneity. In addition, this process enables production to be achieved for any cadmium concentration value x in the solid $(0<x<0.5)$.

Thus, the present invention specifically relates to a process for producing ternary or quaternary semiconductor compounds, particularly of the formula Cd Hg Te or Cd Hg Te Se, with the aid of a known method consisting of passing basic binary or ternary semiconductor compounds through a solvent zone, wherein it comprises the following stages:

producing a homogeneous mixture, having a precise composition and corresponding to the compound to be obtained, of Cd Te and Hg Te powders in the case of the ternary compound Cd Hg Te, and Cd Te Se and Hg Te or Cd Te and Hg Te Se powders in the case of the quaternary compound Cd Hg Te Se;

the mixture is compacted by applying pressure;

the thus compacted mixture undergoes thermal interdiffusion treatment, assisted by a grainwise material transfer, until a homogeneous solid solution of a polycrystalline compound is obtained;

the compound in monocrystalline form is recrystallized by a single passage through the solvent zone.

It is clear that the process according to the invention, which essentially consists of replacing the prior art alloy bars by a homogeneous mixture of powders whose composition is as precise as permitted by weighing on a balance, leads to the production of ternary or quaternary semiconductor compounds by a single passage through the solvent zone. This is more particularly obtained by a thermal interdiffusion treatment of the elements constituting the mixture, said interdiffusion being assisted by a short-distance grainwise material transfer, linked with the vapor pressures of the constituent elements. Thus, prior to the passage through the solvent zone, a solid compound is obtained, which is a true solid solution of a ternary or quaternary polycrystalline material and no longer a juxtaposition or mixture of two compounds, as was the case in the prior art represented by French Pat. EN No. 74 42 769.

Thus, this homogeneous composition material can be very uniformly dissolved by the solvent, which at the solid—liquid thermodynamic equilibrium then crystallizes into a monocrystalline material, which has a homogeneous composition and a good crystalline quality, by means of a single passage of the solvent zone.

The initial compounds can be pulverized by any conventional grinding method, as well as screening and the selection of different grain sizes. Any grain size below 200μ is suitable, but an appropriate distribution of the different grain sizes is desirable.

The very accurate weighing of the powders of the initial compounds, together with the specific mixing thereof, leads, after compacting and interdiffusion treatment, to a very homogeneous ternary or quaternary compound.

Compacting can be carried out with any known compacting equipment, whereby the pressures used can be between 150 and 800 MPa, which pressures are applied in a programmed or unprogrammed manner.

The thus-obtained ingots are placed in a e.g. silica envelope, in which is produced a vacuum for a few hours, followed by vacuum or gas sealing. It is also possible for the envelope to contain beforehand a given quantity of mercury for establishing a vapor during the heat treatment, obviating in this way any decomposition of the mercury chalcogenide.

The interdiffusion heat treatment takes place by placing the sealed envelope in a furnace, e.g. a resistance heating furnace, whilst maintaining therein a temperature between approximately 450° and 700° C., e.g. 600° C., for a few dozen hours. There is no need to very accurately establish the temperature and time. However, if it is desirable to use a higher temperature, account must be taken of the possible melting of the mercury chalcogenide.

Finally, and according to the invention, the interdiffusion of the constituent elements is assisted by a transfer of material linked with the pressures of the vapors of the constitutent elements into the intergranular gaps inherent in the compacting process.

The term thermal interdiffusion treatment assisted by a short-distance material transfer relates to two different phenomena.

On the one hand, it is known that two different solids, when brought into intimate mechanical contact and heated, exchange their constituent types. In the present case two grains of Cd Te and Hg Te in contact at the annealing temperature respectively exchange Cd and Hg atoms, so that after the necessary time solid ternary grains of Cd Hg Te are formed, which represents the interdiffusion phenomenon.

On the other hand, as compacting is not perfect, small empty spaces are left between the grains. Thus, it has been found that Hg Te, when placed at a small distance (less than a few millimeters) from the Cd Te at an adequate temperature, will be transported via the mercury and tellurium vapors to the Cd Te and will then exchange Cd and Hg atoms by interdiffusion, leading to the ternary compound Cd Hg Te. This is what is called the short-distance material transfer (cf. e.g. the report of the Academie des Sciences de Paris, vol. 261, July 26, 1965, p. 931 ff., the article "Croissance epitaxique de couches minces semiconductrices par evaporation-diffusion en regime isotherme".—Note by Gerard Cohen-Solal et al).

According to a feature of the process according to the invention, the solvent used in the solvent zone passage stage is constituted by a mixture of Te and Hg Te. In general terms, the solvent used in chosen from among the compounds Te, $Hg_yTe_z$ and $Cd_xHg_yTe_z$ ($z>0.5$ and $x+y+z=1$), either separately or in combination.

Thus, the performance of the process according to the invention makes it possible to obtain a ternary or quaternary semiconductor compound polycrystal, particularly of formula Cd Hg Te or Cd Hg Te Se of any cadmium atomic composition between 0 and 0.5. This semiconductor compound polycrystal can then be transformed by low-temperature crystallization into a monocrystal of the same compound by a single passage through the solvent zone.

BRIEF DESCRIPTION OF THE DRAWINGS

The process of the invention will be described with reference to the following drawings, wherein:

FIG. 1 is a diagrammatic depiction of the prior art process for producing ternary or quaternary semiconductor compounds;

FIG. 2 is a diagrammatic depiction of the process of the invention, with the mixing, compacting, and interdiffusion treatment steps not depicted.

DETAILED DESCRIPTION OF THE INVENTION

The invention will be better understood from the following description of the process for producing semiconductor compounds with reference to FIG. 2, wherein the reference numerals identify the same elements referred to in connection with FIG. 1. This description is of an illustrative and nonlimitative nature and refers to the production of a ternary composite semiconductor of formula $Cd_{0.15}Hg_{0.35}Te_{0.5}$.

High-purity Cd Te and Hg Te alloys are independently ground and screened as powders passing through 200, 160, 125, 60 and 40μ screens. Cd Te batches on the one hand and Hg Te batches on the other are constituted by 80 wt. % of powder passing through the 200μ screen, 10% of powder passing through the 160μ screen, 6 wt. % of powder passing through the 125μ screen and 4 wt. % of powder passing through the 60μ screen. Each Cd Te batch weighing 7.755 g is intimately mixed with a Hg Te batch weighing 24.745 g. This mixture is then placed in a 24-mm diameter matrix (in the present embodiment) and compacted under a pressure of 180 MPa (the matrix diameter value of 24 mm is not critical). The above pressure is progressively established over a period of a few minutes and is removed in the same way. This is followed by the removal of a compact cylinder having a thickness close to 11 mm and containing a mixture of powders corresponding to the formula $Cd_{0.15}Hg_{0.35}Te_{0.5}$.

Several cylinders prepared in this way are placed in a silica envelope containing a weighed drop of mercury. The envelope pressure is lowered to a vacuum of $10^{-5}$ mbar for five hours and is then vacuum sealed.

The interdiffusion heat treatment is then started. The envelope is placed in a resistance furnace heated to 600° C. The free volume in the envelope and the mass of the drop of mercury is such that the mercury pressure is established at a value of 2 atmospheres. This mercury pressure is not accurately determined and could be as high as 10 atmospheres. If no mercury has been introduced into the envelope, the free volume therein is preferably reduced. After heat treatment lasting 20 hours at 600° C., the envelope is cooled with particular care.

It is possible at this stage to start the recrystallization in the solvent zone. For this purpose, the thus formed blocks of ternary compounds $Cd_{0.15}Hg_{0.35}Te_{0.5}$ are placed in an envelope having an internal diameter of 24 mm and in which has previously been placed a tellurium-rich solvent zone, constituted by 36 g of Hg Te and 16 g of Te, and which has a height of approximately 20 mm. After evacutation and vacuum sealing, the system is introduced at a speed of 0.3 mm/h into an annular furnace at 700° C. After a single passage of the solvent zone, a ternary composite semiconductor ingot is obtained of formula $Cd_{0.15}Hg_{0.35}Te_{0.5}$ which, after a few millimeters, has a monocrystalline zone of several centimeters.

What is claimed is:

1. A process for producing a semiconductor compound selected from the group consisting of Cd Hg Te and Cd Hg Te Se which comprises the steps of
    producing a homogeneous mixture, having a precise composition and corresponding to the compound to be obtained, of Cd Te and Hg Te powders when Cd Hg Te is to be obtained and a mixture selected from the group consisting of (1) Cd Te Se and Hg Te powders and (2) Cd Te and Hg Te Se powders when Cd Hg Te Se is to be obtained;
    compacting the mixture by applying pressure;
    subjecting the thus compacted mixture to thermal interdiffusion treatment, assisted by a grainwise material transfer, until a homogeneous solid solution of a polycrystalline compound is obtained; and
    recrystallizing the compound in monocrystalline form by a single passage through a solvent zone.

2. The process according to claim 1, wherein the thermal interdiffusion treatment is carried out by heating the compacted mixture in vacuo at a temperature between 450° and 700° C. for a period of a few dozen hours.

3. The process according to claim 1, wherein the thermal interdiffusion treatment is carried out by heating the compacted mixture in a gaseous atmosphere at a temperature between 450° and 700° C. for a period of approximately a few dozen hours.

4. The process according to claim 3, wherein the gaseous atmosphere in mercury vapor.

5. The process according to claim 1, wherein the solvent used in the solvent zone passage stage consists of a mixture of Te and Hg Te.

6. The process according to claim 1, wherein the solvent used in the solvent zone passage step is selected from the group consisting of $Hg_yTe_z$, $Cd_xHg_yTe_z$ ($z=0.5$ and $x+y+z=1$), and mixtures thereof.

7. The process according to claim 2, wherein the solvent used in the solvent zone passage stage consists of a mixture of Te and Hg Te.

8. The process according to claim 2, wherein the solvent used in the solvent zone passage step is selected from the group consisting of $Hg_yTe_z$ and $Cd_xHg_yTe_z$ ($z=0.5$ and $x+y+z=1$) and mixtures thereof.

* * * * *